(12) United States Patent
Viswanathan Pillai et al.

(10) Patent No.: US 10,062,451 B2
(45) Date of Patent: Aug. 28, 2018

(54) BACKGROUND MEMORY TEST APPARATUS AND METHODS

(71) Applicant: TEXAS INSTRUMENTS INCORPORATED, Dallas, TX (US)

(72) Inventors: Prasanth Viswanathan Pillai, Bangalore (IN); Saya Goud Langadi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 108 days.

(21) Appl. No.: 15/346,737

(22) Filed: Nov. 9, 2016

(65) Prior Publication Data

US 2017/0133106 A1    May 11, 2017

Related U.S. Application Data

(60) Provisional application No. 62/252,860, filed on Nov. 9, 2015.

(51) Int. Cl.
*G11C 29/42* (2006.01)
*G06F 11/10* (2006.01)
(Continued)

(52) U.S. Cl.
CPC ............ *G11C 29/42* (2013.01); *G06F 11/106* (2013.01); *G06F 11/1068* (2013.01);
(Continued)

(58) Field of Classification Search
CPC ......... G11C 29/42; G11C 29/44; G11C 29/14; G11C 29/16; G11C 29/32;
(Continued)

(56) References Cited

U.S. PATENT DOCUMENTS 4,479,214 A * 10/1984 Ryan ...................... G06F 11/10
714/702
5,588,112 A * 12/1996 Dearth .................. G06F 11/106
710/22
(Continued)

OTHER PUBLICATIONS

I. Mrozek, V. N. Yarmolik and E. Buslowska, "Multi Background Memory Testing," 2008 7th Computer Information Systems and Industrial Management Applications, Ostrava, 2008, pp. 155-156.*

*Primary Examiner* — Cynthia Britt
(74) *Attorney, Agent, or Firm* — Gregory J. Albin; Charles A. Brill; Frank D. Cimino

(57) ABSTRACT

A schedulable memory scrubbing circuit and/or a known-state memory test circuit (collectively, background memory test apparatus ("BGMTA")) are located on-chip with an integrated computing system. The BGMTA operates in parallel with a system CPU but shares a system bus with the CPU. The BGMTA sequentially reads one word at a time from a block of memory to be tested during system bus idle cycles. The schedulable memory scrubbing circuit embodiment tests on-chip parity/ECC memory arrays using memory controller-implemented parity or ECC error detection to trigger error handling interrupts. The known-state memory test circuit embodiment performs CRC calculations on known-state memory arrays as each data word is read sequentially. A final resulting CRC calculation value is compared to a known CRC value for the block, sometimes referred to as a "golden CRC." If the two CRC values differ, a CRC error interrupt is triggered for servicing by the CPU.

20 Claims, 7 Drawing Sheets

(51) Int. Cl.
*G11C 29/44* (2006.01)
*H03M 13/09* (2006.01)
*G11C 29/14* (2006.01)
*G11C 29/16* (2006.01)
*G11C 29/32* (2006.01)
*G11C 29/12* (2006.01)
*G11C 29/18* (2006.01)
*G11C 29/40* (2006.01)

(52) U.S. Cl.
CPC .............. *G11C 29/14* (2013.01); *G11C 29/16* (2013.01); *G11C 29/32* (2013.01); *G11C 29/44* (2013.01); *H03M 13/09* (2013.01); *H03M 13/093* (2013.01); *G11C 2029/1208* (2013.01); *G11C 2029/1806* (2013.01); *G11C 2029/4002* (2013.01)

(58) Field of Classification Search
CPC .... G11C 2029/1208; G11C 2029/1806; G11C 2029/4002; G06F 11/106; G06F 11/1068; H03M 13/09; H03M 13/093
See application file for complete search history.

(56) References Cited

U.S. PATENT DOCUMENTS

| | | | |
|---|---|---|---|
| 6,981,176 B2* | 12/2005 | Fruehling | G06F 11/1008 701/32.8 |
| 7,304,875 B1* | 12/2007 | Lien | G06F 11/1064 365/200 |
| 7,793,175 B1* | 9/2010 | Swarnkar | G11C 29/16 714/718 |
| 8,583,973 B1* | 11/2013 | Chakravarty | G01R 31/31703 714/727 |
| 2001/0044917 A1* | 11/2001 | Lester | G06F 11/1076 714/718 |
| 2004/0088636 A1* | 5/2004 | Cypher | G06F 11/1048 714/764 |
| 2009/0187809 A1* | 7/2009 | Fekih-Romdhane | G06F 11/1008 714/763 |
| 2010/0275073 A1* | 10/2010 | Lasser | G11C 29/08 714/718 |
| 2013/0173970 A1* | 7/2013 | Kleveland | G11C 29/44 714/710 |
| 2013/0212207 A1* | 8/2013 | Ong | G06F 15/167 709/213 |
| 2014/0119129 A1* | 5/2014 | Hendrickson | G11C 11/5621 365/185.22 |
| 2014/0146624 A1* | 5/2014 | Son | G11C 29/4401 365/200 |
| 2015/0187436 A1* | 7/2015 | Querbach | G06F 11/263 714/720 |
| 2016/0179611 A1* | 6/2016 | Le | G06F 11/1012 714/763 |

* cited by examiner

BACKGROUND MEMORY TEST APPARATUS AND METHODS

PRIORITY CLAIM

This application claims the benefit of priority under 35 U.S.C. § 119(e) to U.S. Provisional Patent Application Ser. No. 62/252,860 titled "RUN TIME SELF-TEST OF MEMORIES USING BACKGROUND CRC", filed on Nov. 9, 2015 and incorporated herein by reference in its entirety.

TECHNICAL FIELD

Embodiments described herein relate to on-chip semiconductor memory test circuits, including structures and methods associated with testing known-state memories and/or memories with parity/CRC capability.

BACKGROUND INFORMATION

Among the various genera of semiconductor data storage device technologies ("semiconductor memories" or simply "memories"), known-state and error detection/correction types are known. Error detection/correction types include parity and error correction code ("ECC") memories. Today's compact computing devices (e.g., smart phones, tablet computers, industrial automation devices, automotive subsystems and the like) typically include one or both of the aforesaid memory types. Computing devices are increasingly imbedded in vehicles and other equipment to perform mission-critical functions such as vehicle steering, braking, anti-skid and even self-driving functions. An evolving set of functional safety standards increasingly mandate real-time testing of integrated circuit components imbedded in such mission-critical subsystems. In some cases test intervals referred to as fault tolerant time internals ("FTTIs") are specified. Such intervals may be short relative to program code execution times (e.g., a few milliseconds).

Known-state memories include non-volatile technologies such as masked read-only memories ("ROMs") and programmable read-only memories ("PROMs") fabricated or programmed with a known data set. Known-state memories may also be implemented with memory technologies capable of being read from and written to during normal operation ("read/write" memories) but which retain their storage states during power-off conditions. So-called "flash" memory is an example of the latter type of memory. Even memories that are volatile at power-off may be known-state, to the extent that the latter memory types are written to with known data sets during operation.

Known-state memories are written with information intended by system design to remain unchanged during normal system operation. For example, industrial automation and automotive subsystems may include one or more blocks of known-state memory designed to store programmatic instructions associated with the core operating system, timing critical code and the like. One characteristic of a known-state block of memory is that the contents of the block may be represented by a predetermined value of one or a few memory words resulting from a calculation performed on the contents of the block. Such calculations include the well-known checksum calculation and variants of the well-known cyclic redundancy check ("CRC") calculation method. A real-time test of the integrity of a known-state memory block may be performed by reading the block word-by-word, performing an incremental CRC calculation after reading each word, and comparing the final CRC calculation to the predetermined CRC value.

Parity and ECC memories include one or more reserved bits appended to each memory word. The appended bits are not generally available programmatically to an operating system or to a computer user. Rather, memory controller hardware performs a real-time logical calculation on each data word to be written to determine the state of the parity or ECC bit(s). The memory controller then writes both the data word and the parity/ECC bits corresponding to the binary value of the data word as determined by the real-time logical calculation. In the single-bit parity case, the memory controller is configured to operate with either even or odd parity. Operating with even parity, for example, the memory controller sets the parity bit if a parity calculation on the data word, excluding the parity bit, determines that the data word is of odd parity. Doing so causes the complete word, data plus parity bit, to be even. If the data word to be written were of even parity, the memory controller would reset the parity bit in order to maintain even parity.

When the memory is accessed, the memory controller expects to see the configured parity state across any data word read and that word's corresponding parity bit, given that the controller imposes the configured parity state on all words written to the memory by controlling the state of the parity bit. If the controller detects a parity state opposite the configured operating parity regimen, the controller generates an interrupt to the CPU to flag a memory error.

It is noted that such single-bit parity schemes are capable of detecting single-bit errors in a given data word. Two errors in a data word results in the latter word being read with the configured parity state and would thus go undetected. A block of deteriorating memory typically, but not always, exhibits increasing numbers of bad (e.g., "stuck") bits with the passage of time. Consequently, the more frequently a particular memory address is read, the more likely the parity integrity check system will catch and flag single-bit errors. If an address is accessed infrequently, the more likely the memory cells corresponding to that address will have experienced a double-bit error that would go undetected with a simple parity integrity check regimen.

ECC memories operate with a similar detection system as described above for parity memory but with multiple integrity check bits appended to the data word. Consequently, ECC memories are able to detect a number of bit errors corresponding to the number of appended ECC bits. Some memory controllers also perform error correction operations using word data written redundantly to the ECC bit field. In either case, the principle of increasing the likelihood of detecting memory bit errors by increasing the frequency of accessing each memory block address holds for both parity and ECC memory error detection schemes.

SUMMARY OF THE INVENTION

Apparatus and methods described herein are collocated on a semiconductor die with a processor and one or more memory arrays. Invented hardware embodiments operate in the background to test the memory arrays during normal processor program execution. Doing so helps to ensure ongoing memory integrity with minimal impact on system throughput. Background operation is effected by sequentially reading one word at a time from a block of memory to be tested during system bus idle cycles. Doing so results in substantially parallel system program execution and periodic or continuous memory array integrity testing. Such parallel architecture functions to meet the FTTI requirement of the aforementioned functional safety standards with minimal processor overhead and minimal impact on system throughput.

The on-chip test apparatus includes one or both of a schedulable memory scrubbing circuit to test on-chip parity/ECC memory arrays and a known-state memory test circuit to test on-chip known-state memory arrays. The terms "parity/ECC" and "parity" are used synonymously as adjectives hereinafter below. As used herein, the term "known-state memory array" means either a read-only memory fabricated or programmed to a known state or a read/write memory to be written with a known data set.

The schedulable memory scrubbing circuit reads from each address of selected memory blocks with a selected periodicity as determined by a memory test scheduler. The disclosed technique relies on memory controller-implemented parity or ECC error detection to trigger error handling CPU interrupts. Doing so increases the probability of finding such errors quickly, given that some memory locations may rarely be accessed by regular system programs.

The known-state memory test circuit performs a CRC calculation of a memory block whose contents are static, such as core components of a smart phone operating system (e.g., a "system ROM"). The CRC calculation progresses as each data word is read sequentially, one word at a time. The final resulting CRC calculation value is compared to a known CRC value for the block, sometimes referred to as a "golden CRC." If the two CRC values differ, a CRC error interrupt is triggered for servicing by the CPU.

One or both of the schedulable memory scrubbing circuit and the known-state memory test circuit, referred subsequently herein singly or collectively as background memory test apparatus ("BGMTA") are included on-chip with processor and memory components according to the types of memory arrays(s) included on the die.

DETAILED DESCRIPTION

Figure 1:
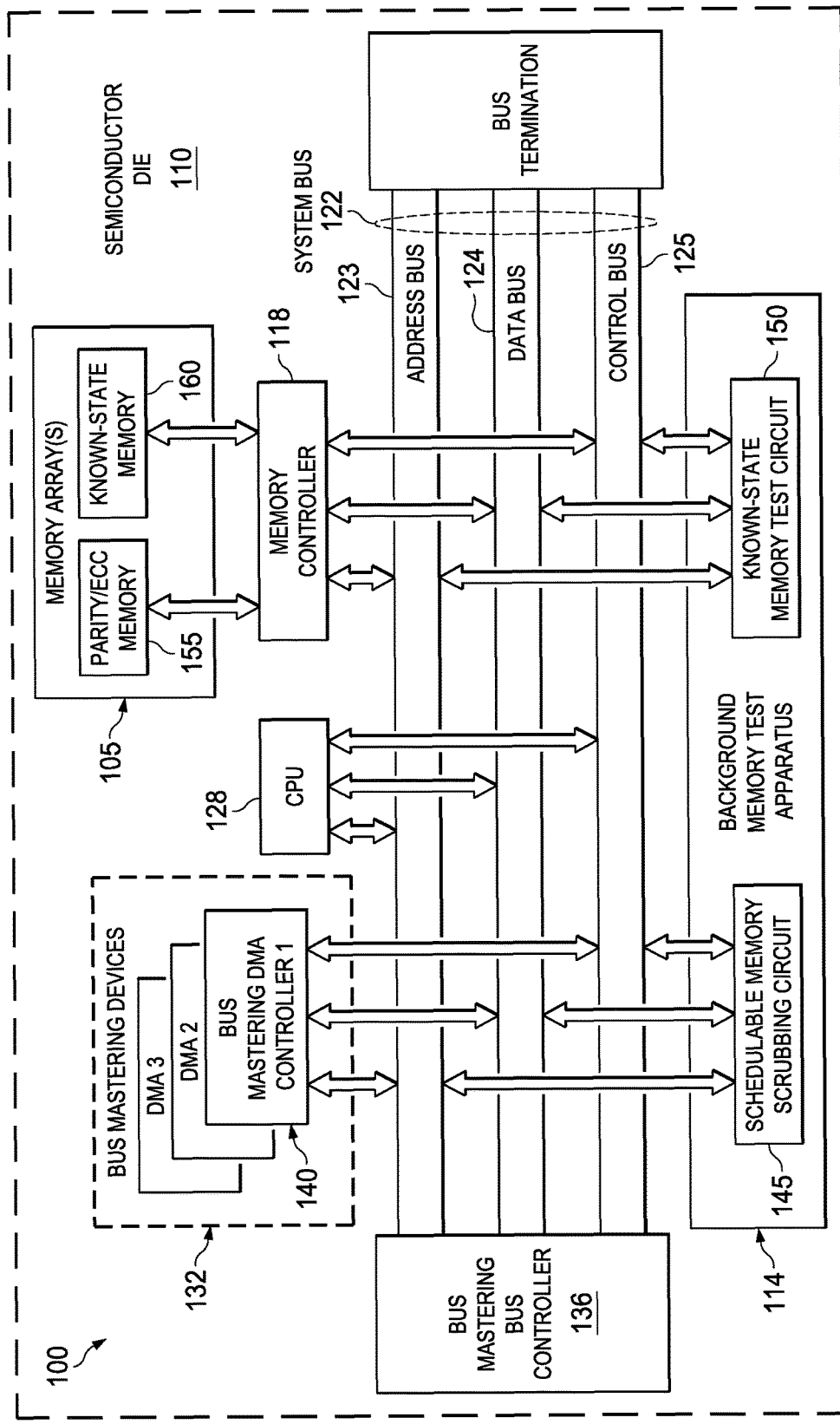
FIG. 1 is a block diagram of an integrated computing system including one or more memory arrays and background memory test apparatus according to various example embodiments of the invention.

FIG. 1 is a block diagram of an integrated computing system 100 including one or more memory arrays 105 and BGMTA 114 according to various example embodiments of the invention. The memory arrays 105 and the BGMTA 114 are integrated with other components of the computing system 100 into a common semiconductor package. Various components of the integrated computing system 100 may be fabricated on one or more semiconductor die(s) 110 included in a common semiconductor package.

The integrated computing system 100 includes a BGMTA 114 fabricated on the die 110. The BGMTA 114 operates cooperatively with a memory controller 118. The BGMTA 114 and the memory controller 118 are coupled to a system bus 122 and communicate via the system bus 122. The system bus 122 may be serial or parallel as is well-known in the art. Examples embodiments herein are illustrated with a parallel bus, including an address bus portion 123, a data bus portion 124 and a control bus portion 125, without limitation.

A CPU 128 is also coupled to the system bus 122 and communicates with the memory controller 118 via the system bus 122. Additional devices 132, including input/output devices such as network interfaces, may also be coupled to the system bus 122. The additional devices 132 communicate with the memory controller 118 and/or with each other via the system bus 122 and with minimal intervention of the CPU 128. The latter independent communication technique, referred to as first-party direct memory access ("DMA") and "bus mastering," is well-known in the art.

The integrated computing system 100 also includes a bus controller 136. The bus controller 136 arbitrates device contention for access to the system bus 122. Each DMA-capable bus-attached device includes a DMA controller (e.g., the DMA controller 140) to interact with the bus controller 136. The device DMA controllers manage contention access to the system bus 122 for each device.

The integrated BGMTA 114 includes a schedulable memory scrubbing circuit 145 and/or a known-state memory test circuit 150. The schedulable memory scrubbing circuit 145 periodically tests one or more on-chip parity and/or ECC memory arrays 155 as further described below. The known-state memory test circuit 150 tests one or more known-state memory arrays 160 as further described below.

Figure 2:
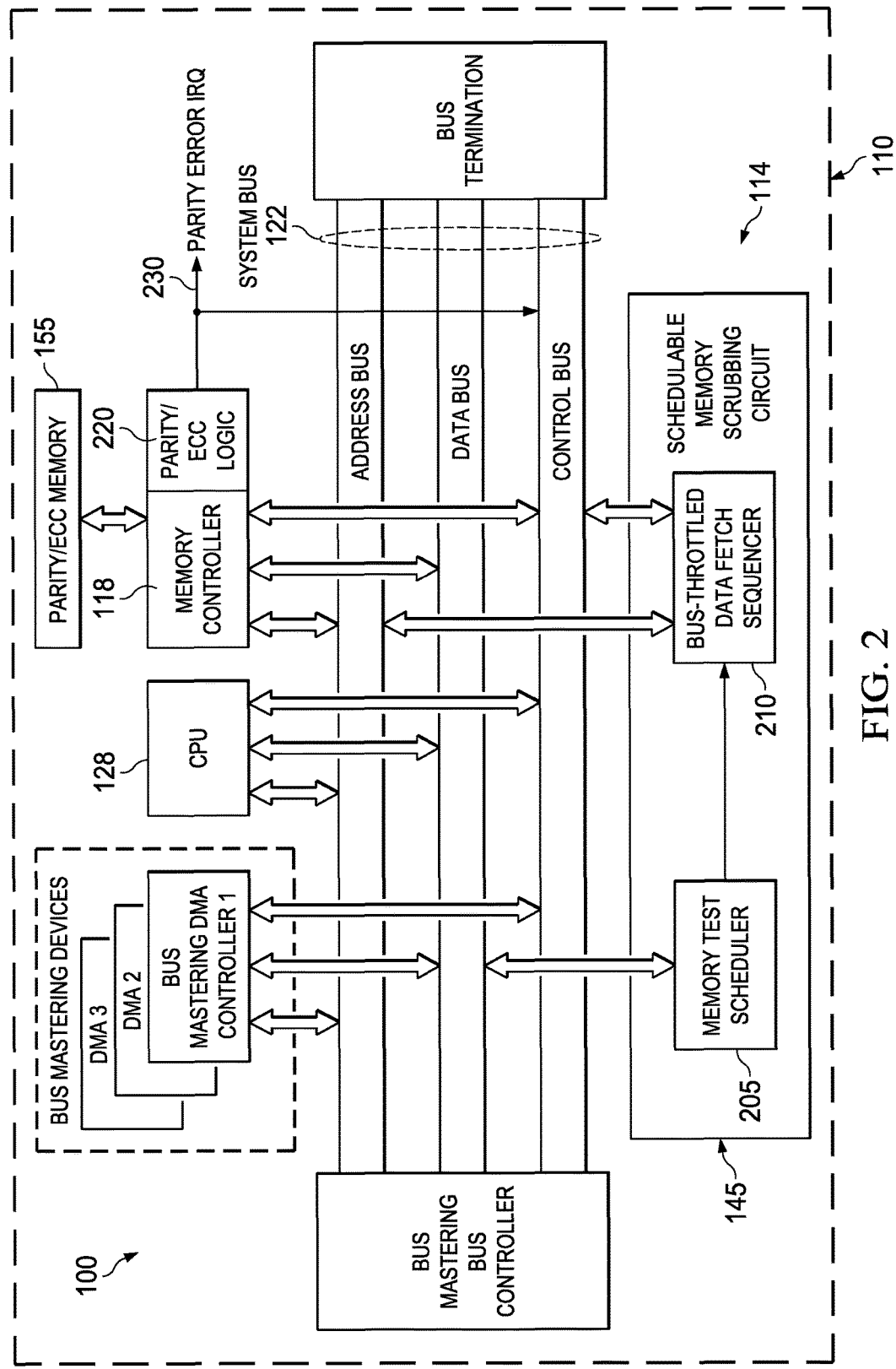
FIG. 2 is a block diagram of an integrated computing system including a schedulable memory scrubbing circuit according to various example embodiments.

FIG. 2 is a block diagram of an integrated computing system 100 including a schedulable memory scrubbing circuit 145 according to various example embodiments. In addition to the schedulable memory scrubbing circuit 145, the computing system 100 includes a memory controller 118, a system bus 122, a CPU 128, and parity/ECC memory arrays 155, all co-located on a semiconductor die 110 and coupled together as described above with reference to FIG. 1.

The schedulable memory scrubbing circuit 145 includes a memory test scheduler 205 and a data fetch sequencer 210 coupled to the memory test scheduler 205. The memory array 155 is structured with a data word length to include a data field portion plus either a parity bit or a number of error correction code ("ECC") bits.

The data fetch sequencer 210 accesses the parity/ECC memory array 155 at times when the system bus 122 is idle. More specifically, the memory controller 118 addresses each data word from the memory array 155 in response to address and control commands generated by the data fetch sequencer 210 at the system bus 122. A parity/ECC logic portion 220 of the memory controller 118 exerts a parity error interrupt 230 to the CPU 128 if the memory controller 118 detects a parity error in a data word addressed in response to the commands generated by the data fetch sequencer 210.

Figure 3:
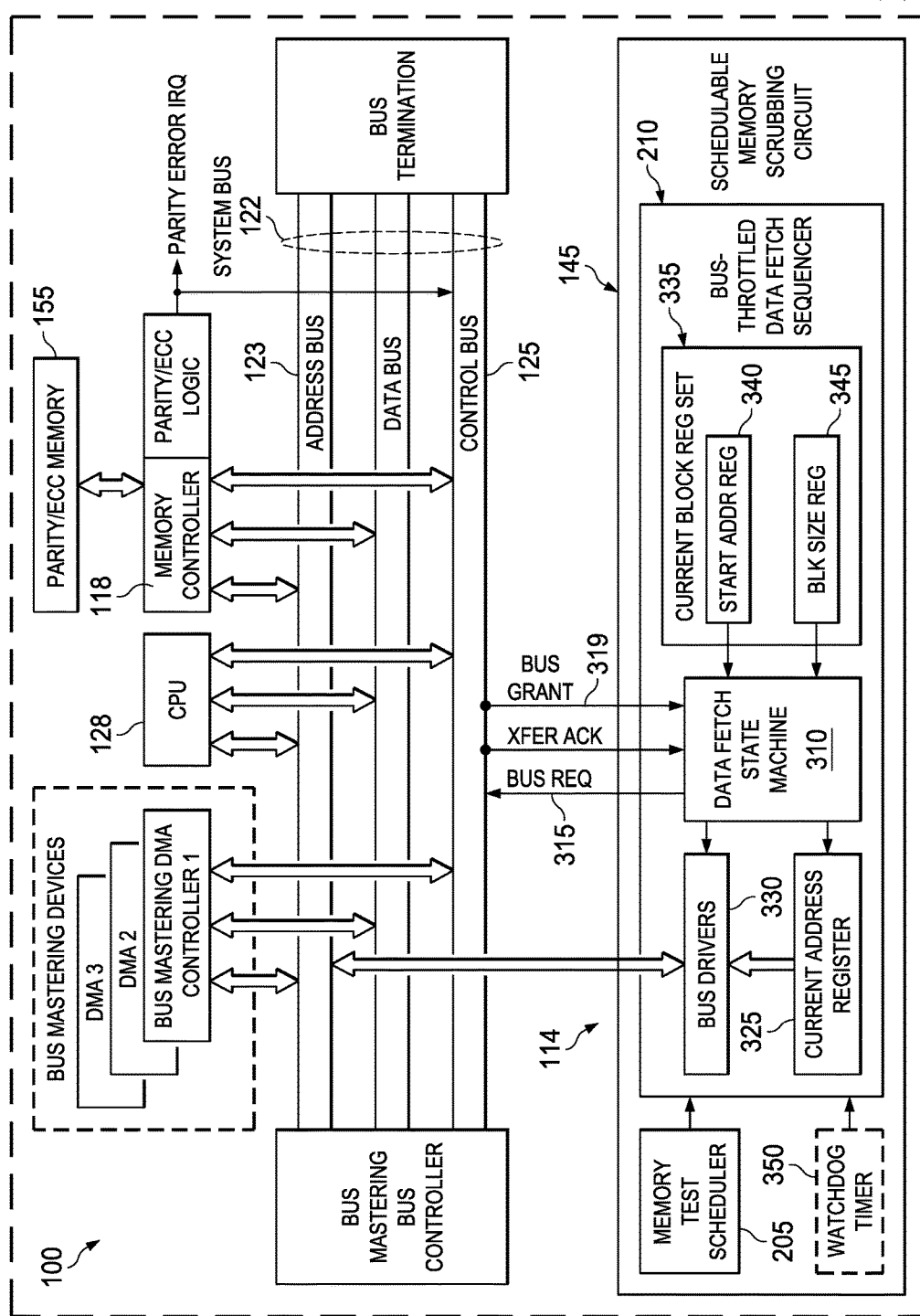
FIG. 3 is a block diagram of an integrated computing system including detail of a data fetch sequencer portion of a schedulable memory scrubbing circuit according to various example embodiments.

FIG. 3 is a block diagram of an integrated computing system 100 including detail of the data fetch sequencer 210 of the schedulable memory scrubbing circuit 145 according to various example embodiments. The data fetch sequencer 210 includes a data fetch state machine 310 coupled to a control bus portion 125 of the system bus 122. The data fetch state machine 310 generates a bus request command 315 to the memory controller 118. The data fetch state machine 310 also enables an address word at an address bus portion 123 of the system 122 bus in response to a bus grant signal 319 received from the memory controller 118. The address word corresponds to a location in the memory array 155 to be accessed. The data fetch state machine 310 repeats the bus request 315, bus grant 319, and address enablement sequence for each address of a block of addresses associated with the memory array 155. It is noted that the descriptive terms "bus request command" and "bus grant signal" are example terms chosen to indicate their respective functions. Actual terms for commands and signals which perform equivalent functions may differ according to various implementations of the system bus 122.

The data fetch sequencer 210 also includes a current address register 325 coupled to the data fetch state machine 310. The current address register 325 stores the address word corresponding to the next location in the memory array 155 to be accessed. The data fetch sequencer 210 also includes a bus driver logic module 330 coupled to the current address register 325. The bus driver logic module 330 presents the address word stored in the current address register 325 to the address bus 123.

The data fetch sequencer 210 further includes a current block register set 335 coupled to the data fetch state machine 210. The current block register set 335 stores memory address boundary values corresponding to a block of the memory array 155 to be tested. The current block register set 335 provides the boundary values to the data fetch state machine 310 to facilitate sequencing through each address of the block of the memory array 155 to be tested. For some embodiments, for example, the current block register set includes a block starting address register 340 and a block size register 345. Alternatively, the current block register set may include the block starting address register 340 and a block ending address register, or equivalent-function registers to store memory address boundary values used to represent a block of the memory array 155 to be tested.

Some embodiments of the schedulable memory scrubbing circuit 210 may also include a watchdog timer 350 coupled to the data fetch sequencer 210. The watchdog timer 350 generates a BGMTA servicing interrupt to the CPU 128 if the data fetch sequencer 210 fails to complete all accesses to a memory block to be tested within a first predetermined amount of time. The latter condition is an indication of a possible failure in the schedulable memory scrubbing circuit 210. The watchdog timer 350 may also generate a BGMTA 114 servicing interrupt if a second predetermined amount of time between an exertion of the bus request signal 315 and a receipt of the bus grant signal 319 is exceeded. The latter condition is an indication that bus idle cycle frequency is insufficient to allow for effective operation of the BGMTA 114.

Figure 4:
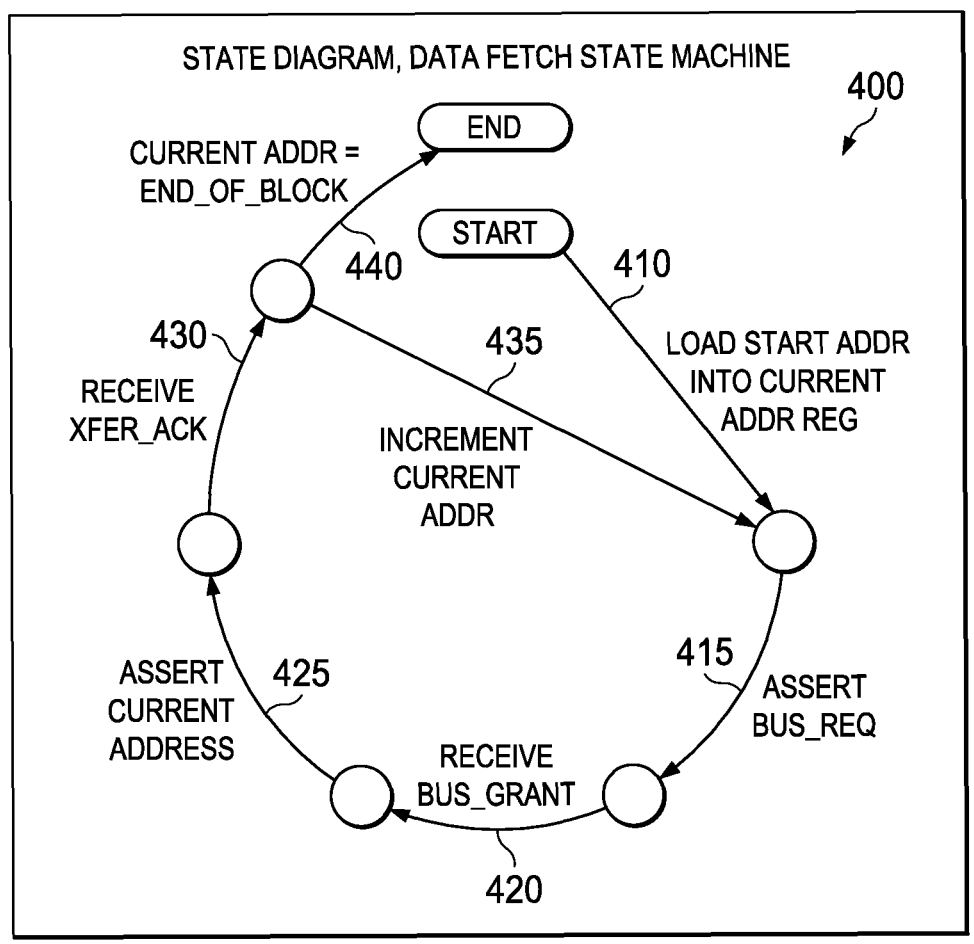
FIG. 4 is a state diagram illustrating an example operating sequence associated with a data fetch state machine component of a data fetch sequencer according to various embodiments.

FIG. 4 is a state diagram illustrating an example block access operating sequence 400 associated with the data fetch state machine component 310 of the data fetch sequencer 210 according to various example embodiments. The operating sequence 400 commences by loading a block starting address into a current address register at activity 410. The sequence 400 continues at activity 415 with asserting a bus request signal/command. The sequence 400 includes receiving a bus grant signal when the system bus is idle, at activity 420. The sequence 400 also includes asserting an address corresponding to a memory block to be accessed, at activity 425. The sequence 400 further includes receiving a transfer acknowledge indication from the system bus that the requested block address has been successfully accessed and that a data word corresponding to the requested block address in stable on the data bus, at activity 430. If the requested address is not the final address in the memory block under test, the sequence 400 includes incrementing the current address in preparation for a subsequent access cycle, at activity 435. If the requested address is the final address in the memory block under test, the block access sequence 400 terminates at activity 440.

Figure 5:
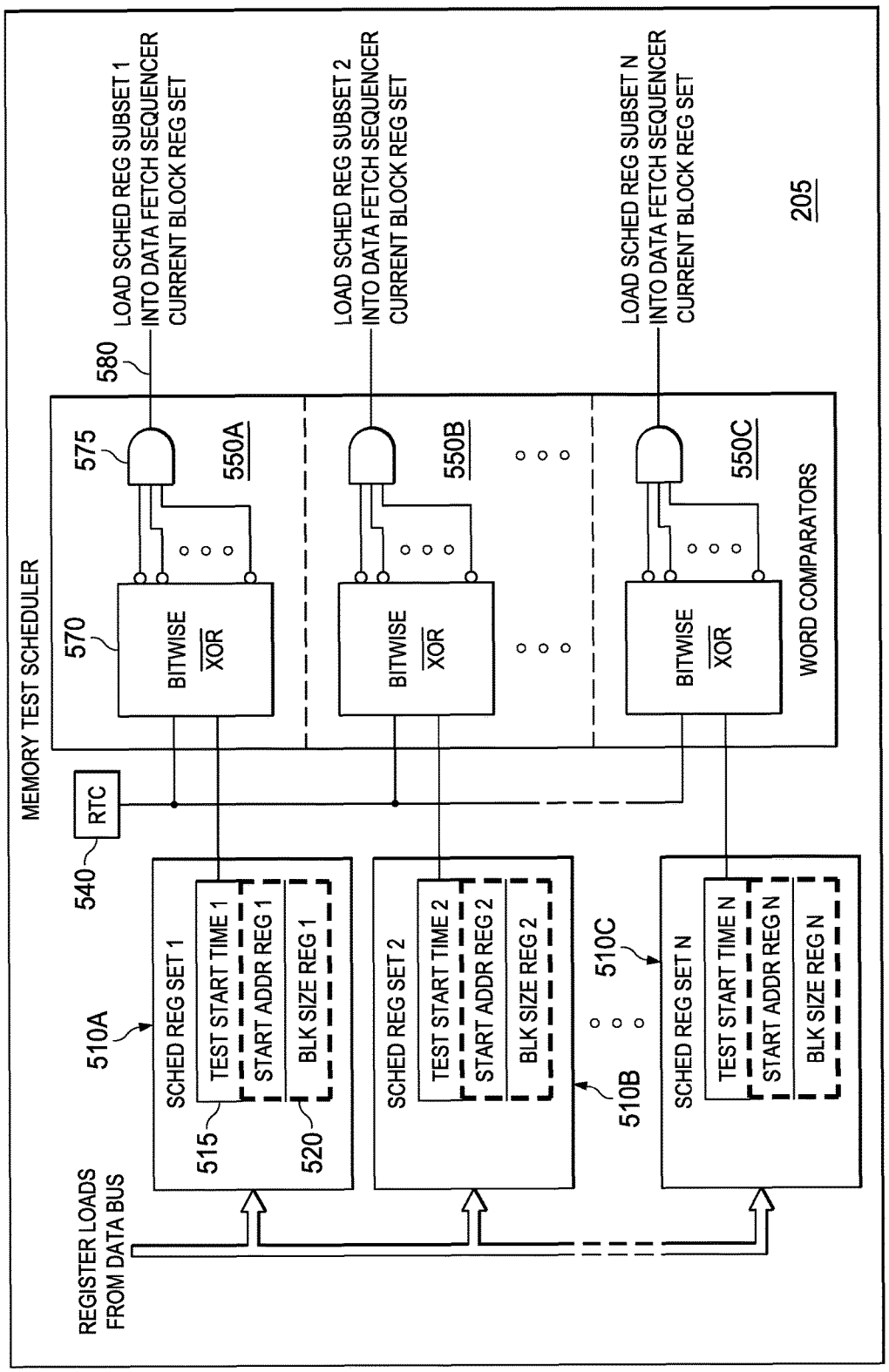
FIG. 5 is a logic diagram of a memory test scheduler according to various example embodiments.

FIG. 5 is a logic diagram of a memory test scheduler 205 associated with a BGMTA (e.g., the BGMTA 114 of FIGS. 2 and 3) according to various example embodiments. The memory test scheduler 205 includes one or more scheduler register set(s) (e.g., the scheduler register sets 510A, 510B . . . 510C). Each of the scheduler register sets stores a test start time 515 and a memory block boundary-determining subset of values in a register subset 520. Each scheduler register set corresponds to a memory block to be tested at a particular time. It is noted, however, that a single memory block may be tested at multiple times by including its address boundary-determining parameters in more than one scheduler register set.

The memory test scheduler 205 also includes a real-time clock ("RTC") 540 to generate a value corresponding to a current time-of-day. The memory test scheduler 205 further includes a word comparator (e.g., the word comparators 550A, 550B . . . 550C coupled to the test start time register associated with each scheduler register set (e.g., the scheduler register sets 510A, 510B . . . 510C, respectively) and to the RTC 540. Each word comparator generates a load command to load a corresponding memory block boundary-determining subset of values into the current block register set 335 of the data fetch sequencer 210 of FIG. 3.

In an example embodiment, the word comparator 550A, 550B . . . 550C is implemented as a negated output bitwise exclusive OR logic module 570 with outputs coupled to an AND gate 575 to generate the load command as an active-high logic level at an output 580. The latter example embodiment of the word comparators 550A, 550B . . . 550C is merely an example. Other word comparator embodiments as known in the art are contemplated by this disclosure.

Figure 6:
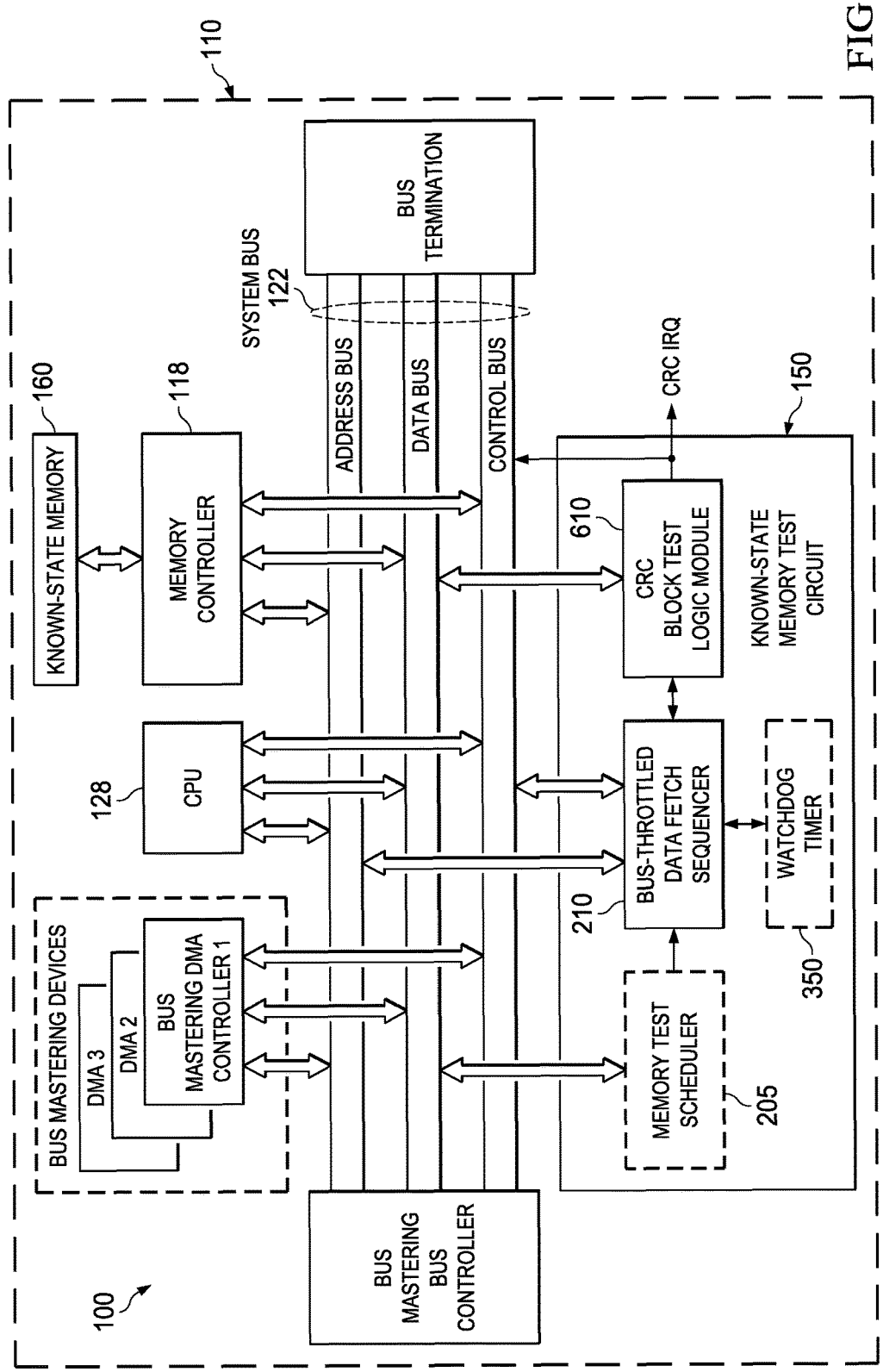
FIG. 6 is a block diagram of an integrated computing system including a known-state memory test circuit according to various example embodiments.

FIG. 6 is a block diagram of an integrated computing system 100 including a known-state memory test circuit 150 according to various example embodiments. The known-state memory test circuit 150 includes a data fetch sequencer 210 co-located on a semiconductor die 110 with a CPU 128 coupled to a known-state memory array 160 via a system bus 122. The known-state memory array 160 may be a read-only memory fabricated or programmed with a known data set or a read/write memory to be written with a known data set. The data fetch sequencer 210 accesses the known-state memory array 160 at times when the system bus 210 is idle.

The integrated computing system 100 also includes a CRC block test logic module 610 coupled to the data fetch sequencer 210. The CRC block test logic module 610 receives a block of data words, one word at a time, calculates an intermediate CRC value as each data word is received, and compares a final CRC value to a known memory block CRC value after a last data word of the block is received. The CRC block test logic module 610 generates a CRC error interrupt request to the CPU 128 if the final CRC value does not match the known CRC value.

Some embodiments of the known-state memory test circuit 150 also include a watchdog timer 350 coupled to the data fetch sequencer 210. The watchdog timer operates as described above with respect to FIG. 3.

Some embodiments of the known-state memory test circuit 150 include a memory test scheduler 205 coupled to the data fetch sequencer 210. The memory test scheduler 205 operates as described above with reference to FIG. 5 to initiate testing of one or more blocks of the known-state memory array 160 at predetermined times.

Figure 7:
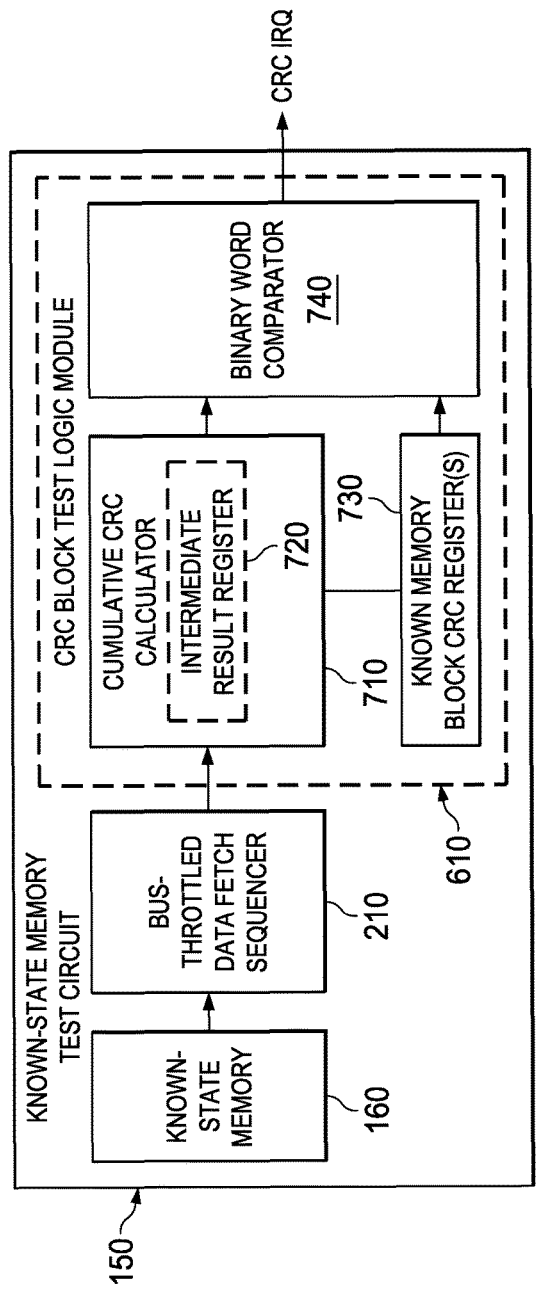
FIG. 7 is a block diagram of a known-state memory test circuit according to various example embodiments.

FIG. 7 is a block diagram of a known-state memory test circuit (e.g., the known-state memory test circuit 150 of FIG. 6) according to various example embodiments. FIG. 7 illustrates additional detail of the CRC block test logic module 610. The CRC block test logic module 610 includes a cumulative CRC calculator 710 communicatively coupled to the known-state memory 160. The cumulative CRC calculator 710 calculates the final CRC value for each data block as described above. The cumulative CRC calculator 710 includes an intermediate result register 720 to store the intermediate CRC values as each data word is received. The CRC block test logic module 610 also includes one or more known memory block CRC register(s) 730 coupled to the cumulative CRC calculator 710. The known memory block CRC registers 730 store the known data block CRC values, one for each data block to be tested.

The CRC block test logic module 610 further includes a binary word comparator 740 coupled to the cumulative CRC calculator 710 and to the known memory block CRC registers 730. The binary word comparator 740 compares the final CRC value to the known CRC value and generates a CRC error interrupt request to the CPU if the final CRC value does not match the known CRC value.

It is noted that some integrated computing systems may include multiple memory controllers and/or system buses. In such a system, a memory array associated with a first memory controller may be accessed by a first bus mastering device while a different memory array associated with a second memory controller is being accessed by a second bus mastering device. Consequently, embodiments of the BGMTA 114, a bus mastering device, may perform integrity checking operations on a memory array associated with one memory controller while the CPU 128 and other bus mastering devices are each accessing other memory arrays, each associated with a memory controller other than the memory controller being accessed by the BGMTA 114. The latter memory testing scenario adds little or no additional latency to normal system operation.

Figure 8:
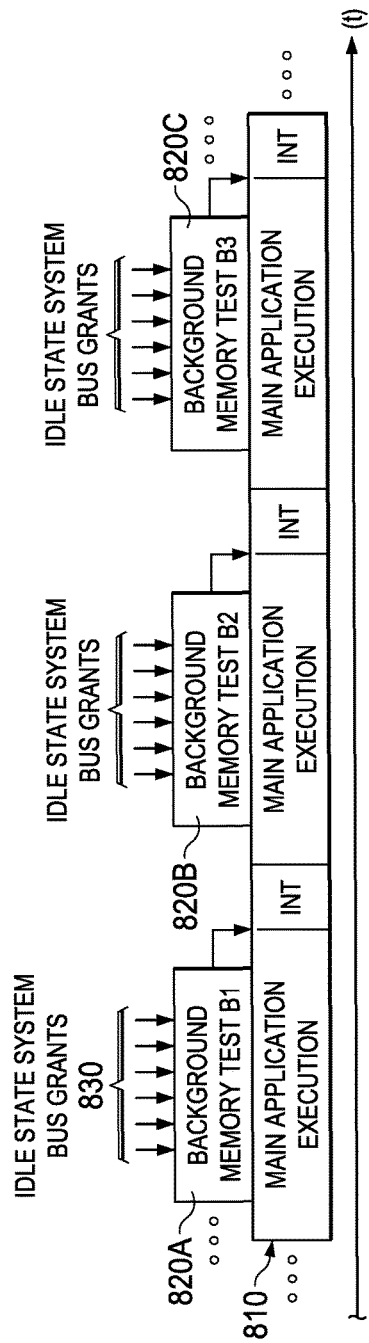
FIG. 8 is a time line diagram illustrating an example background memory block test sequence performed by background memory test apparatus disclosed herein.

FIG. 8 is a time line diagram illustrating an example background memory block test sequence performed by a BGMTA disclosed herein (e.g., BGMTA 114 of FIG. 1). Non-testing program execution 810 is performed by the CPU 128 in the integrated computing system 100. Background testing 820A, 820B . . . 820C of memory blocks B1, B2 . . . B3, respectively, is performed by the BGMTA 114 hardware in parallel with the non-testing program execution 810. It will be recalled from the earlier discussion that testing of each memory block proceeds asynchronously on a word-by-word basis as system bus idle states permit. An example set 830 of idle state system bus grants associated with read operations from a single memory block are illustrated as being evenly distributed over time. In reality, however, the spacing between each successive system bus grant to the BGMTA 114 hardware is dependent upon overall system bus activity at the time of each BGMTA 114 system bus request.

As illustrated by FIG. 8, the CPU 128 does not expend cycles in conjunction with the parallel hardware-executed memory testing operations other than loading the various BGMTA 114 hardware registers and servicing any interrupts occasioned by memory word failures found during testing. Control registers associated with example embodiments of the memory test scheduler 205 of FIG. 5 may be loaded infrequently by the CPU 128, as the testing of each memory block is triggered by the RTC 540. Thus, the schedulable memory scrubbing circuit 145 used to test parity/ECC memory arrays 155 may require minimal intervention of the CPU 128. Likewise, known-state memory test circuit embodiments of the BGMTA 114 optionally employing a memory test scheduler 205 may require infrequent servicing by the CPU 128 for similar reasons. On the other hand, known-state memory test circuit embodiments of the BGMTA 114 not employing a memory test scheduler 205 may require loading of the current block register set 335 at the data fetch sequencer 210 (e.g., as illustrated by FIG. 3) for each block of known-state memory 160 to be tested.

Apparatus and methods described herein may be useful in applications other than the testing of on-die memory arrays by on-die BGMTA apparatus. Examples of the system 100, the BGMTA 114, the schedulable memory scrubbing circuit 145, the memory test scheduler 205, the data fetch sequencer 210 and the known-state memory test circuit 150 described herein are intended to provide a general understanding of the structures of various embodiments and the sequences associated with various methods. They are not intended to serve as complete descriptions of all elements and features of apparatus, systems and methods that might make use of these example structures and sequences.

By way of illustration and not of limitation, the accompanying figures show specific embodiments through which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Accordingly, although specific embodiments have been illustrated and described herein, any arrangement calculated to achieve the same purpose may be substituted for the specific embodiments shown. This disclosure is intended to cover any and all adaptations or variations of the various disclosed embodiments.

The Abstract of the Disclosure is provided to comply with 37 C.F.R. § 1.72(b) requiring an abstract to allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing with the claims from which it depends as a separate embodiment.

What is claimed is:

1. An on-chip background memory test apparatus, comprising:
   a memory test scheduler co-located on a semiconductor die with a central processing unit ("CPU") communicatively coupled to a memory array via a system bus; and
   a data fetch sequencer coupled to the memory test scheduler, the data fetch sequencer to access the memory array at times when the system bus is idle.

2. The on-chip background memory test apparatus of claim 1, the memory array structured with a data word length including a data field portion and at least one of a parity bit or a plurality of error correction code ("ECC") bits.

3. The on-chip background memory test apparatus of claim 1, further comprising:
   a memory controller coupled to the data fetch sequencer to address a data word from the memory array in response to address and control commands generated by the data fetch sequencer at the system bus.

4. The on-chip background memory test apparatus of claim 3, the memory controller further comprising:
   a parity logic portion of the memory controller to exert a parity error interrupt to the CPU if the memory controller detects a parity error in a data word addressed in response to the commands generated by the data fetch sequencer.

5. The on-chip background memory test apparatus of claim 1, the data fetch sequencer further comprising:
   a data fetch state machine coupled to a control bus portion of the system bus, the data fetch state machine to generate a bus request command to the memory controller and to enable an address word at an address bus portion of the system bus in response to a bus grant signal received from the memory controller and to repeat the bus request, bus grant and address enablement sequence for each address of a block of addresses associated with the memory array.

6. The on-chip background memory test apparatus of claim 5, the data fetch sequencer further comprising:
   a current address register coupled to the data fetch state machine to store the address word; and
   a bus driver logic module coupled to the current address register to present the address word to the address bus.

7. The on-chip background memory test apparatus of claim 5, the data fetch sequencer further comprising:
   a current block register set coupled to the data fetch state machine to store memory address boundary values corresponding to a block of the memory array to be tested and to provide the boundary values to the data fetch state machine.

8. The on-chip background memory test apparatus of claim 7, the current block register set further comprising:
   a block starting address register; and
   a block size register.

9. The on-chip background memory test apparatus of claim 1, further comprising:
   a watchdog timer coupled to the data fetch sequencer to generate a background memory test apparatus servicing interrupt to the CPU if the data fetch sequencer fails to complete all accesses to a memory block to be tested within a first predetermined amount of time or if a second predetermined amount of time between an exertion of a bus request signal and a receipt of a bus grant signal is exceeded.

10. The on-chip background memory test apparatus of claim 1, the memory test scheduler comprising:
    at least one scheduler register set to store a test start time and a memory block boundary-determining subset of values;
    a real-time clock ("RTC") to generate a value corresponding to a current time-of-day; and
    a word comparator coupled to the scheduler register set and to the RTC to generate a load command to load the memory block boundary-determining subset of values into the data fetch sequencer current block register set.

11. The on-chip background memory test apparatus of claim 10, the word comparator comprising:
    a negated output bitwise exclusive OR logic module; and
    an AND gate coupled to the exclusive OR logic module to generate the load command.

12. An on-chip background memory test apparatus, comprising:
    a data fetch sequencer co-located on a semiconductor die with a central processing unit ("CPU") communicatively coupled to a known-state memory array via a system bus, the data fetch sequencer to access the known-state memory array at times when the system bus is idle; and
    a cyclic redundancy code ("CRC") block test logic module coupled to the data fetch sequencer to receive a block of data words, to calculate an intermediate CRC value as each data word is received, to compare a final cumulative CRC value to a known data block CRC value associated with the block of data words after a last data word of the block is received, and to generate a CRC error interrupt request to the CPU if the final cumulative CRC value does not match the known data block CRC value.

13. The on-chip background memory test apparatus of claim 12, the known-state memory being at least one of a read-only memory fabricated to include a known data set, a programmable read-only memory programmed with a known data set, or a read/write memory to be written with a known data set.

14. The on-chip background memory test apparatus of claim 12, the CRC block test logic module comprising:
    a cumulative CRC calculator communicatively coupled to the known-state memory to calculate the final cumulative CRC value;
    at least one known memory block CRC register coupled to the CRC calculator to store the known data block CRC value; and
    a binary word comparator coupled to the cumulative CRC calculator and to the known memory block CRC register to compare the final cumulative CRC value to the known data block CRC value and to generate the CRC error interrupt request to the CPU if the final cumulative CRC value does not match the known data block CRC value.

15. The on-chip background memory test apparatus of claim 12, the CRC block test logic module further comprising:

an intermediate result register portion of the cumulative CRC calculator to store the intermediate CRC value calculated as each data word is received.

16. The on-chip background memory test apparatus of claim 12, further comprising:
a memory test scheduler coupled to the data fetch sequencer to initiate testing of at least one block of a known-state memory array at a predetermined time.

17. An on-chip background memory test apparatus, comprising:
a memory test scheduler co-located on a semiconductor die with a central processing unit ("CPU") communicatively coupled to a plurality of memory arrays via a system bus;
a data fetch sequencer coupled to the memory test scheduler, the data fetch sequencer to access the memory arrays at times when the system bus is idle; and
a cyclic redundancy code ("CRC") block test logic module coupled to the data fetch sequencer to receive a block of data words, to calculate a cumulative CRC value as each data word is received, to compare a final CRC value to a known CRC value associated with the block of data words after a last data word of the block is received, and to generate a CRC error interrupt request to the CPU if the final CRC value does not match the known CRC value.

18. The on-chip background memory test apparatus of claim 17, the plurality of memory arrays including at least one parity-type memory array, at least one ECC type memory array, and/or at least one known-state type memory array.

19. The on-chip background memory test apparatus of claim 17, further including:
a plurality of bus mastering devices, each bus mastering device having a bus mastering direct memory access ("DMA") controller; and
a bus mastering bus controller to grant access by each of the bus mastering devices to the system bus based upon a priority pre-assigned to each bus mastering device, the background memory test apparatus having a lowest priority.

20. The on-chip background memory test apparatus of claim 17, further including:
a watchdog timer coupled to the data fetch sequencer to generate a background memory test apparatus servicing interrupt to the CPU if the data fetch sequencer fails to complete all accesses to a memory block to be tested within a first predetermined amount of time or if a second predetermined amount of time between an exertion of a bus request signal and a receipt of a bus grant signal is exceeded.

* * * * *